United States Patent
Lin et al.

(10) Patent No.: US 12,538,540 B2
(45) Date of Patent: Jan. 27, 2026

(54) SEMICONDUCTOR DEVICE AND MANUFACTURING METHOD THEREOF

(71) Applicant: UNITED MICROELECTRONICS CORP., Hsin-Chu (TW)

(72) Inventors: Da-Jun Lin, Kaohsiung (TW); Fu-Yu Tsai, Tainan (TW); Bin-Siang Tsai, Changhua County (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 538 days.

(21) Appl. No.: 17/844,746

(22) Filed: Jun. 21, 2022

(65) Prior Publication Data

US 2023/0378275 A1    Nov. 23, 2023

(30) Foreign Application Priority Data

May 23, 2022  (CN) .......................... 202210561154.2

(51) Int. Cl.
*H10D 62/85*   (2025.01)
*H10D 30/01*   (2025.01)
(Continued)

(52) U.S. Cl.
CPC ....... *H10D 62/8503* (2025.01); *H10D 30/015* (2025.01); *H10D 30/475* (2025.01); *H10D 62/824* (2025.01)

(58) Field of Classification Search
CPC . H10D 62/82–8503; H10D 62/80–881; H10D 30/01–015; H10D 30/061–0616; H10D 30/47–4755
(Continued)

(56) References Cited

U.S. PATENT DOCUMENTS 9,761,438 B1 * 9/2017 Chu .................. H01L 23/291
10,192,986 B1  1/2019 Khalil
(Continued)

FOREIGN PATENT DOCUMENTS

TW        202146716 A   12/2021
TW         I755277 B    2/2022

OTHER PUBLICATIONS

Wang M.J. et al, Effects of the passivation of SiNx with various growth stoichiometry on the high temperature transport properties of the two-dimensional electron gas in AlxGa1-xN/GaN heterostructures, Apr. 27, 2007, Physics Letters A 369, Elsevier ScienceDirect, pp. 249-254, 2007.*

(Continued)

*Primary Examiner* — Michael G Lee
(74) *Attorney, Agent, or Firm* — Winston Hsu

(57) ABSTRACT

A semiconductor device includes a III-V compound semiconductor layer, a silicon-doped III-V compound barrier layer, and a silicon-rich tensile stress layer. The silicon-doped III-V compound barrier layer is disposed on the III-V compound semiconductor layer, and the silicon-rich tensile stress layer is disposed on the silicon-doped III-V compound barrier layer. A manufacturing method of a semiconductor device includes the following steps. A III-V compound barrier layer is formed on a III-V compound semiconductor layer. A silicon-rich tensile stress layer is formed on the III-V compound barrier layer. An annealing process is performed after the silicon-rich tensile stress layer is formed. A part of silicon in the silicon-rich tensile stress layer diffuses into the III-V compound barrier layer for forming a silicon-doped III-V compound barrier layer by the annealing process.

10 Claims, 8 Drawing Sheets

(51) Int. Cl.
*H10D 30/47* (2025.01)
*H10D 62/824* (2025.01)

(58) Field of Classification Search
USPC .......................................................... 257/211
See application file for complete search history.

(56) References Cited

U.S. PATENT DOCUMENTS

| | | | | |
|---|---|---|---|---|
| 2001/0028100 | A1* | 10/2001 | Schmitz | H01L 23/3171 |
| | | | | 257/649 |
| 2007/0164315 | A1* | 7/2007 | Smith | H01L 21/318 |
| | | | | 257/E29.253 |
| 2009/0001384 | A1* | 1/2009 | Kosaki | H10D 30/4755 |
| | | | | 257/77 |
| 2012/0280233 | A1* | 11/2012 | Lee | H10D 8/60 |
| | | | | 257/E29.081 |
| 2014/0001438 | A1* | 1/2014 | Kim | H01L 21/02587 |
| | | | | 257/18 |
| 2014/0070280 | A1* | 3/2014 | Briere | H10D 30/015 |
| | | | | 257/194 |
| 2017/0133499 | A1* | 5/2017 | Mizue | H10D 30/475 |
| 2017/0271492 | A1* | 9/2017 | Chiu | H10D 62/824 |
| 2017/0338332 | A1* | 11/2017 | Tadjer | H01L 21/02458 |
| 2019/0165032 | A1* | 5/2019 | Fiorenza | H10F 77/1246 |
| 2020/0219987 | A1* | 7/2020 | Lee | H01L 21/02378 |

OTHER PUBLICATIONS

Kang B.S. et al., Effect of external strain on the conductivity of high-electron-mobility-transistors, Dec. 28, 2003, Applied Physics Letters 83, pp. 4845-4847, 2003.*

Kang B.S. et al., Effect of external strain on the conductivity of high-electron-mobility-transistors, Dec. 28, 2003, Applied Physics Letters 83, pp. 4845-4847, 2003 (Year: 2003).*

Maeda Narihiko et al, Enhanced effect of polarization on electron transport properties in AlGaN/GaN double-heterostructure field-effect transistors, May 22, 2000, Applied Physics Letters 76, pp. 3118-3120, 2000 (Year: 2000).*

Tsuneishi , Ti silicide electrodes low contact resistance for undoped AlGaN/GaN structure, 222nd ECS meeting ,Oct. 11, 2012.

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a III-V compound semiconductor layer and a manufacturing method thereof.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and heterojunction is formed at the junction between the semiconductor materials as a channel for carriers. In recent years, gallium nitride (GaN) based materials have been applied in the high power and high frequency products because of the properties of wider bandgap and high saturation velocity. Two-dimensional electron gas (2DEG) may be generated by the piezoelectricity property of the GaN-based materials, and the switching velocity may be enhanced because of the higher electron velocity and the higher electron density of the 2DEG. Therefore, how to further improve the electrical performance of transistors formed with III-V compound materials by modifying materials, structures and/or manufacturing methods has become a research direction for people in the related fields.

SUMMARY OF THE INVENTION

A semiconductor device and a manufacturing method thereof are provided in the present invention. A silicon-rich tensile stress layer is used to form a silicon-doped III-V compound barrier layer for reducing electrical resistance of a channel region in the semiconductor device, and related electrical performance of the semiconductor device may be enhanced accordingly.

According to an embodiment of the present invention, a manufacturing method of a semiconductor device is provided. The manufacturing method includes the following steps. A III-V compound barrier layer is formed on a III-V compound semiconductor layer. A silicon-rich tensile stress layer is formed on the III-V compound barrier layer. An annealing process is performed after the silicon-rich tensile stress layer is formed. A part of silicon in the silicon-rich tensile stress layer diffuses into the III-V compound barrier layer for forming a silicon-doped III-V compound barrier layer by the annealing process.

According to an embodiment of the present invention, a semiconductor device is provided. The semiconductor device includes a III-V compound semiconductor layer, a silicon-doped III-V compound barrier layer, and a silicon-rich tensile stress layer. The silicon-doped III-V compound barrier layer is disposed on the III-V compound semiconductor layer. The silicon-rich tensile stress layer is disposed on the silicon-doped III-V compound barrier layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
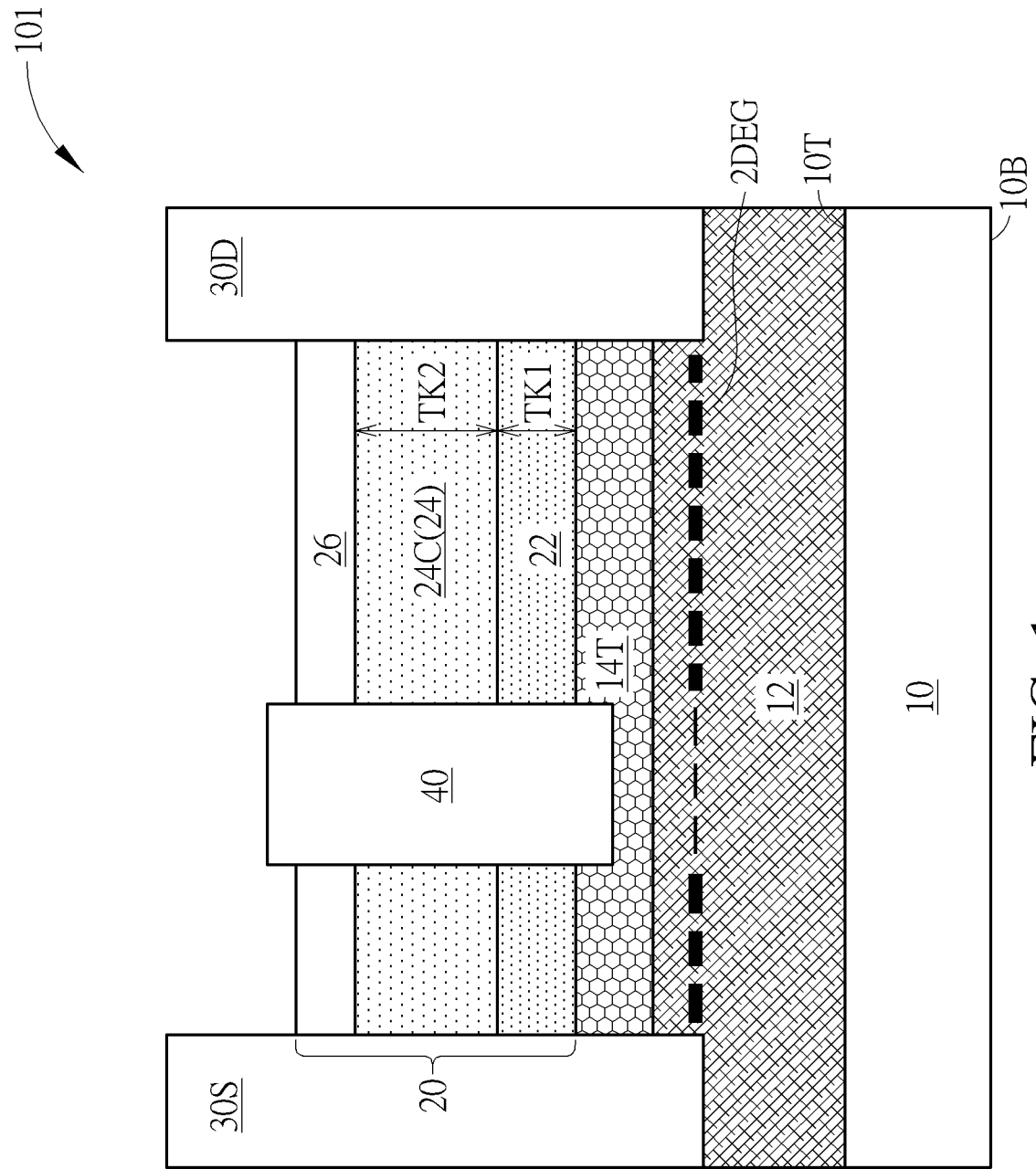
FIG. 1 is a schematic drawing illustrating a semiconductor device according to an embodiment of the present invention.

Please refer to FIG. 1. FIG. 1 is a schematic drawing illustrating a semiconductor device 101 according to an embodiment of the present invention. As shown in FIG. 1, the semiconductor device 101 includes a III-V compound semiconductor layer 12, a silicon-doped III-V compound barrier layer 14T, and a silicon-rich tensile stress layer 22. The silicon-doped III-V compound barrier layer 14T is disposed on the III-V compound semiconductor layer 12. The silicon-rich tensile stress layer 22 is disposed on the silicon-doped III-V compound barrier layer 14T. The silicon-rich tensile stress layer 22 and the silicon-doped III-V compound barrier layer 14T may be used to increase the tensile stress applied to a channel region in the semiconductor device 101, the electrical resistance of the channel region in the semiconductor device may be lowered accordingly, and the related electrical performance of the semiconductor device may be enhanced.

For example, in some embodiments, two-dimensional electron gas 2DEG may be formed at a position in the III-V compound semiconductor layer 12 adjacent to the interface between III-V compound semiconductor layer 12 and the silicon-doped III-V compound barrier layer 14T. The density of the two-dimensional electron gas 2DEG may be increased by increasing the tensile stress applied to the channel region, and the electrical resistance of the region including the two-dimensional electron gas 2DEG may be therefore lowered. Accordingly, the on-resistance (Ron) of the semiconductor device 101 may be reduced, and the purpose of power saving may be achieved. Additionally, in the figures of the present invention, the location of the two-dimensional electron gas 2DEG is presented by a dotted line, and the width of the dotted line may represent the concentration of the two-dimensional electron gas 2DEG. For instance, the relatively thin dotted line may represent the two-dimensional electron gas with a relatively low concentration, and the relatively thick dotted line may represent the two-dimensional electron gas with a relatively high concentration, but not limited thereto.

Specifically, in some embodiments, the semiconductor device 101 may further include a substrate 10, and the III-V compound semiconductor layer 12 may be disposed on a top surface 10T of the substrate 10 in a vertical direction D1. The substrate 10 may include a silicon substrate, a silicon carbide (SiC) substrate, a gallium nitride (GaN) substrate, a sapphire substrate, or a substrate made of other suitable materials. In some embodiments, a buffer layer (not illustrated) may be formed on the substrate 10 before the step of forming the III-V compound semiconductor layer 12, and the buffer layer may include gallium nitride, aluminum gallium nitride (AlGaN), aluminum indium nitride (AlInN), or other suitable buffer materials, but not limited thereto. In other words, the buffer layer may be located between the substrate 10 and the III-V compound semiconductor layer 12 in the vertical direction D1.

In some embodiments, the III-V compound semiconductor layer 12 may include gallium nitride, indium gallium nitride (InGaN), or other suitable III-V compound semiconductor materials. The silicon-doped III-V compound barrier layer 14T may include silicon-doped aluminum gallium nitride, silicon-doped aluminum indium nitride, silicon-doped aluminum gallium indium nitride (AlGaInN), silicon-doped aluminum nitride (AlN), or other suitable silicon-doped III-V compound materials. The silicon-rich tensile stress layer 22 may include silicon nitride, silicon carbide, or other silicon-containing materials with the desired tensile stress properties. In some embodiments, there is a substantially positive correlation between the tensile stress and the silicon content in the silicon-rich tensile stress layer 22, and the silicon-rich tensile stress layer 22 may be regarded as a silicon-containing tensile stress layer with relatively high silicon concentration, but not limited thereto. In some embodiments, the desired tensile stress property may be obtained by modifying the process conditions for forming the silicon-rich tensile stress layer 22. For example, the process power, the process pressure, the process temperature, the flow rate of the reacting gases, and/or the ratio of the reacting gases may be modified, but not limited thereto. In some embodiments, the tensile stress of the silicon-rich tensile stress layer 22 may be greater than or equal to 500 N/cm$^2$, so as to provide the desired effect, but not limited thereto. In some embodiments, the tensile stress of the silicon-rich tensile stress layer 22 may range from 200 N/cm$^2$ to 600 N/cm$^2$ for avoiding adverse influence coming with excessive tensile stress.

In some embodiments, the vertical direction D1 described above may be regarded as a thickness direction of the substrate 10. The substrate 10 may have the top surface 10T and a bottom surface 10B opposite to the top surface 10T in the vertical direction D1, and the III-V compound semiconductor layer 12, the silicon-doped III-V compound barrier layer 14T, and the silicon-rich tensile stress layer 22 described above may be formed at a side of the top surface 10T. A horizontal direction substantially orthogonal to the vertical direction D1 (such as a horizontal direction D2 or other directions orthogonal to the vertical direction D1) may be substantially parallel with the top surface 10T and/or the bottom surface 10B of the substrate 10, but not limited thereto. In this description, a distance between the bottom surface 10B of the substrate 10 and a relatively higher location and/or a relatively higher part in the vertical direction D1 may be greater than a distance between the bottom surface 10B of the substrate 10 and a relatively lower location and/or a relatively lower part in the vertical direction D1. The bottom or a lower portion of each component may be closer to the bottom surface 10B of the substrate 10 in the vertical direction D1 than the top or upper portion of this component. Another component disposed above a specific component may be regarded as being relatively far from the bottom surface 10B of the substrate 10 in the vertical direction D1, and another component disposed under a specific component may be regarded as being relatively close to the bottom surface 10B of the substrate 10 in the vertical direction D1.

In some embodiments, the semiconductor device 101 may further include a passivation layer 24 and an ultraviolet (UV)-transparent protection layer 26. The passivation layer 24 is disposed on the silicon-rich tensile stress layer 22, and the UV-transparent protection layer 26 is disposed on the passivation layer 24. The passivation layer 24 may include silicon oxide, aluminum oxide, or other suitable insulation materials, and the UV-transparent protection layer 26 may include a silicon nitride material with UV-transmitting property or other insulation materials with UV-transmitting properties. In some embodiments, the tensile stress of the silicon-rich tensile stress layer 22 may be higher than a tensile stress of the passivation layer 24, and the passivation layer 24 may be relatively thick for tensile stress adjustment in the passivation layer 24 with related processes. Therefore, a thickness TK2 of the passivation layer 24 may be greater than a thickness TK1 of the silicon-rich tensile stress layer 22, and the passivation layer 24 may be regarded as an embedded stress modulator, but not limited thereto.

In some embodiments, the UV-transparent protection layer 26 may also have relatively low water vapor transmission rate and/or relatively low water oxygen transmission rate for protecting the passivation layer 24 and other material layer and reducing the influence of the external environment, and the tensile stress of the passivation layer 24 may be higher than a tensile stress of the UV-transparent protection layer 26, but not limited thereto. In some embodiments, the silicon-rich tensile stress layer 22, the passivation layer 24, and the UV-transparent protection layer 26 may be regarded as a passivation structure 20 together. The shapes and/or the areas of the projection pattern of the silicon-rich tensile stress layer 22 in the vertical direction D1, the projection pattern of the passivation layer 24 in the vertical direction D1, and the projection pattern of the UV-transparent protection layer 26 in the vertical direction D1 may be substantially identical to or equal to one another, but not limited thereto. In other words, the semiconductor device 101 may include the passivation structure 20, and the passivation structure 20 may be composed of three different material layers, so as to increase and/or modify the tensile stress applied to the channel region in the semiconductor device 101.

In some embodiments, the semiconductor device 101 may further include a source structure 30S, a drain structure 30D, and a gate structure 40. The source structure 30S and the drain structure 30D may penetrate through the UV-transparent protection layer 26, the passivation layer 24, and the silicon-rich tensile stress layer 22 in the vertical direction D1. In some embodiments, the source structure 30S and the drain structure 30D may further penetrate through the silicon-doped III-V compound barrier layer 14T in the vertical direction D1 for directly contacting the III-V compound semiconductor layer 12, but not limited thereto. In some embodiments, the source structure 30S and the drain structure 30D may not penetrate through the silicon-doped III-V compound barrier layer 14T, a portion of the silicon-doped III-V compound barrier layer 14T may be located between the source structure 30S and the III-V compound semiconductor layer 12 in the vertical direction D1, and Another portion of the silicon-doped III-V compound barrier layer 14T may be located between the drain structure 30D and the III-V compound semiconductor layer 12 in the vertical direction D1 accordingly, but not limited thereto.

In some embodiments, the passivation layer 24 may be encompassed by the silicon-rich tensile stress layer 22, the UV-transparent protection layer 26, the source structure 30S, and the drain structure 30D in the vertical direction D1 and the horizontal direction D2. The gate structure 40 may be located between the source structure 30S and the drain structure 30D in the horizontal direction D2, and the gate structure 40 may penetrate through the UV-transparent protection layer 26, the passivation layer 24, and the silicon-rich tensile stress layer 22 in the vertical direction D1, but not limited thereto. In some embodiments, the gate structure 40 may be partly disposed in the silicon-doped III-V compound barrier layer 14T without penetrating through the silicon-doped III-V compound barrier layer 14T. In some embodiments, the gate structure 40 may contact the top surface of the silicon-doped III-V compound barrier layer 14T without being partly disposed in the silicon-doped III-V compound barrier layer 14T.

In some embodiments, the gate structure 40, the source structure 30S, and the drain structure 30D may include electrically conductive metallic materials or other suitable electrically conductive materials. The electrically conductive metallic materials mentioned above may include gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above-mentioned materials, a stack layer of the above-mentioned materials, or an alloy of the above-mentioned materials, but not limited thereto. In some embodiments, the gate structure 40 may include a gate electrode (not illustrated) formed with the above-mentioned electrically conductive material and a gate dielectric layer (not illustrated) located under the gate electrode. The material of the gate dielectric layer may include aluminum nitride, silicon nitride (such as $Si_3N_4$), silicon oxide (such as $SiO_2$), aluminum oxide (such as $Al_2O_3$), hafnium oxide (such as $HfO_2$), lanthanum oxide (such as $La_2O_3$), lutetium oxide (such as $Lu_2O_3$), lanthanum lutetium oxide (such as $LaLuO_3$), or other appropriate dielectric materials. In some embodiments, the semiconductor device 101 may be regarded as a transistor structure, such as a high electron mobility transistor (HEMT), but not limited thereto.

Figure 2:
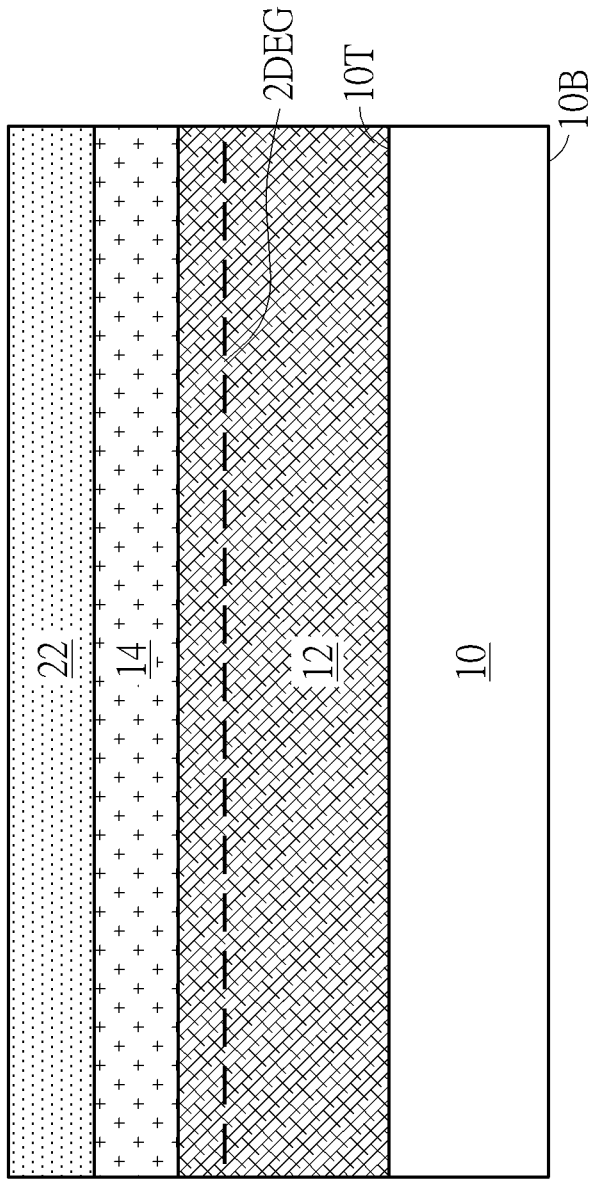
Figure 3:
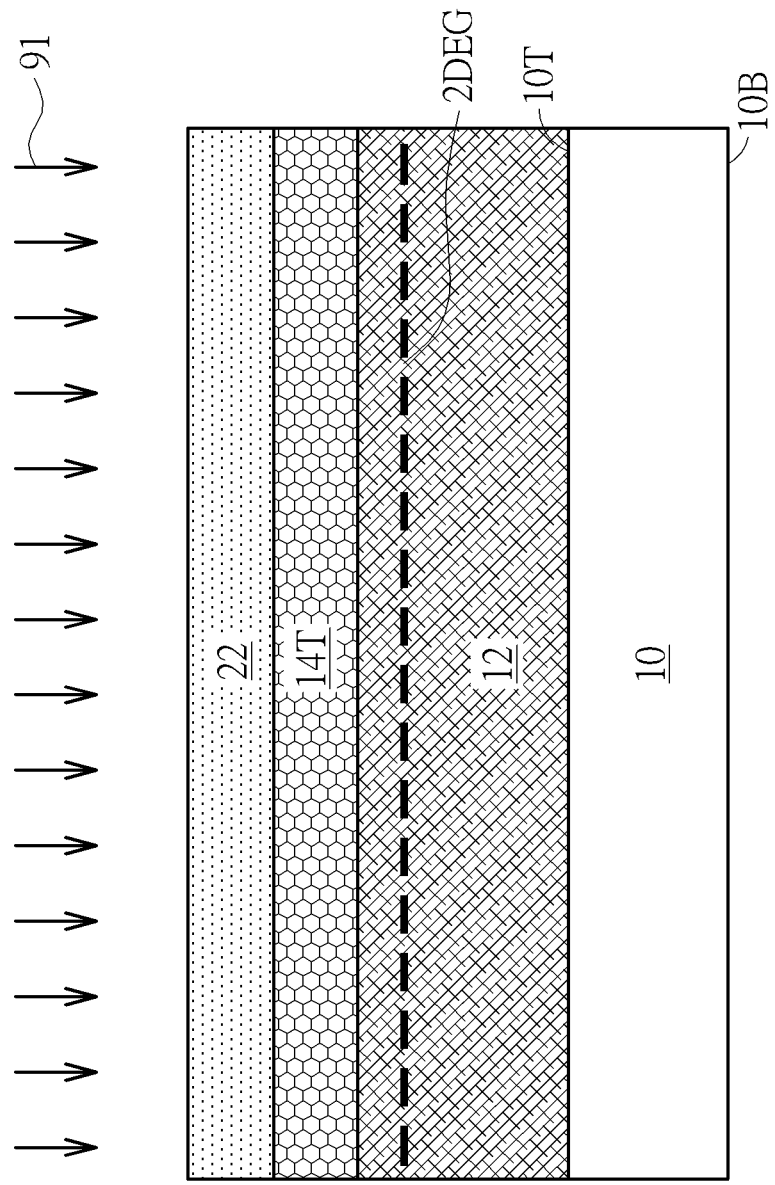
Figure 4:
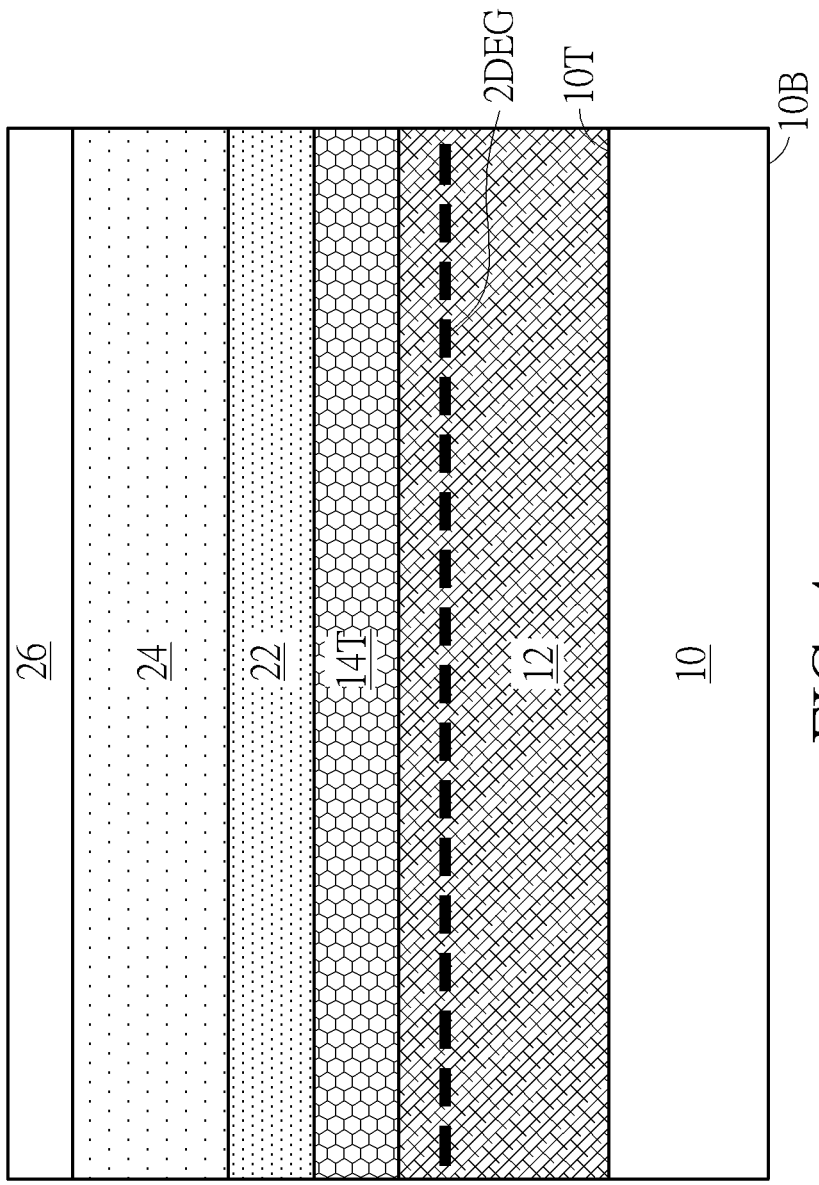
Figure 5:
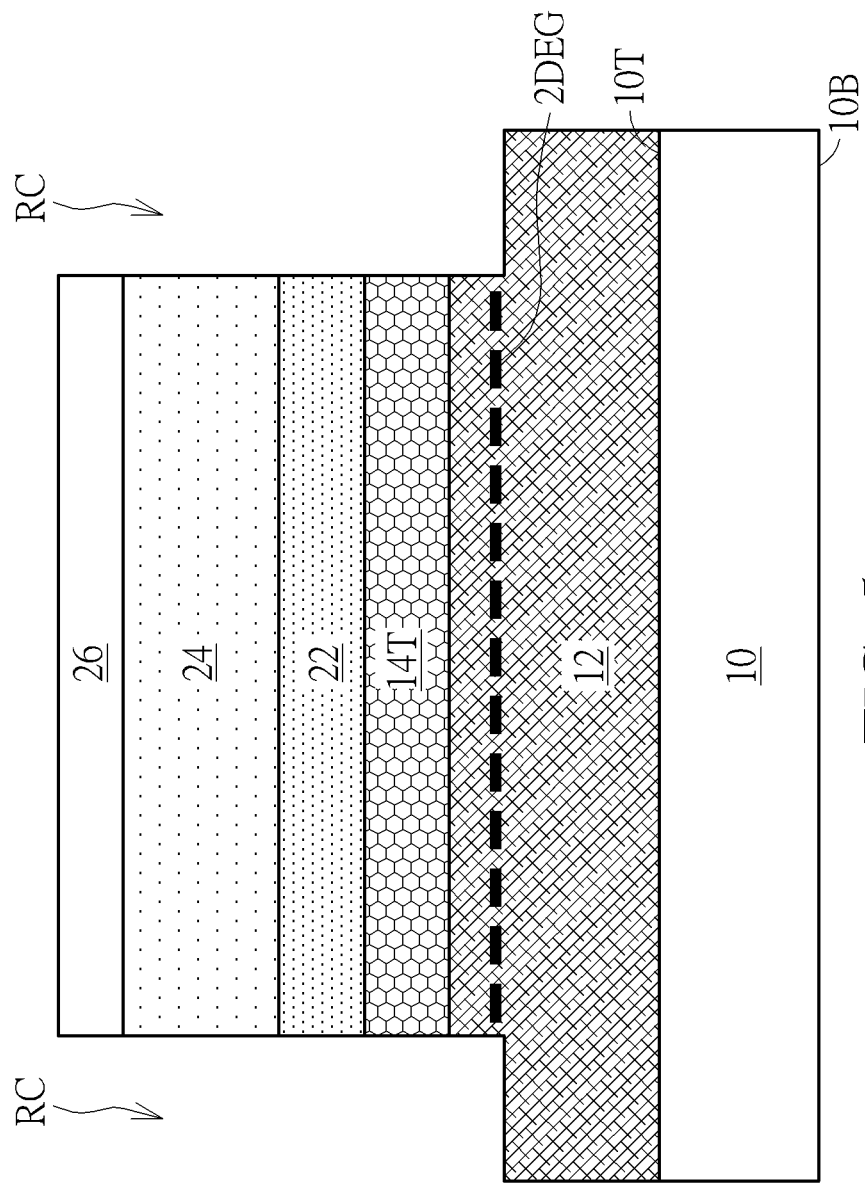
Figure 6:
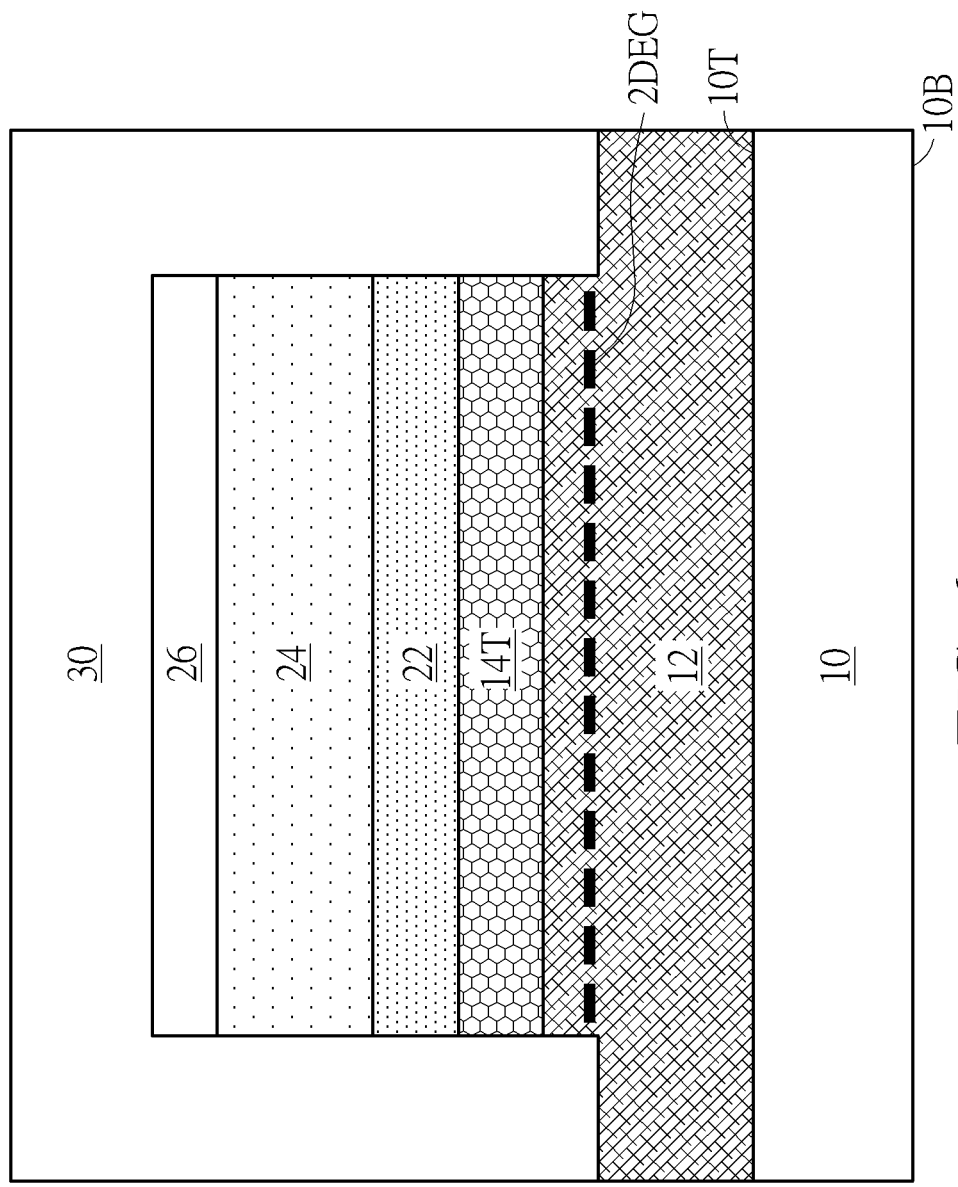
Figure 7:
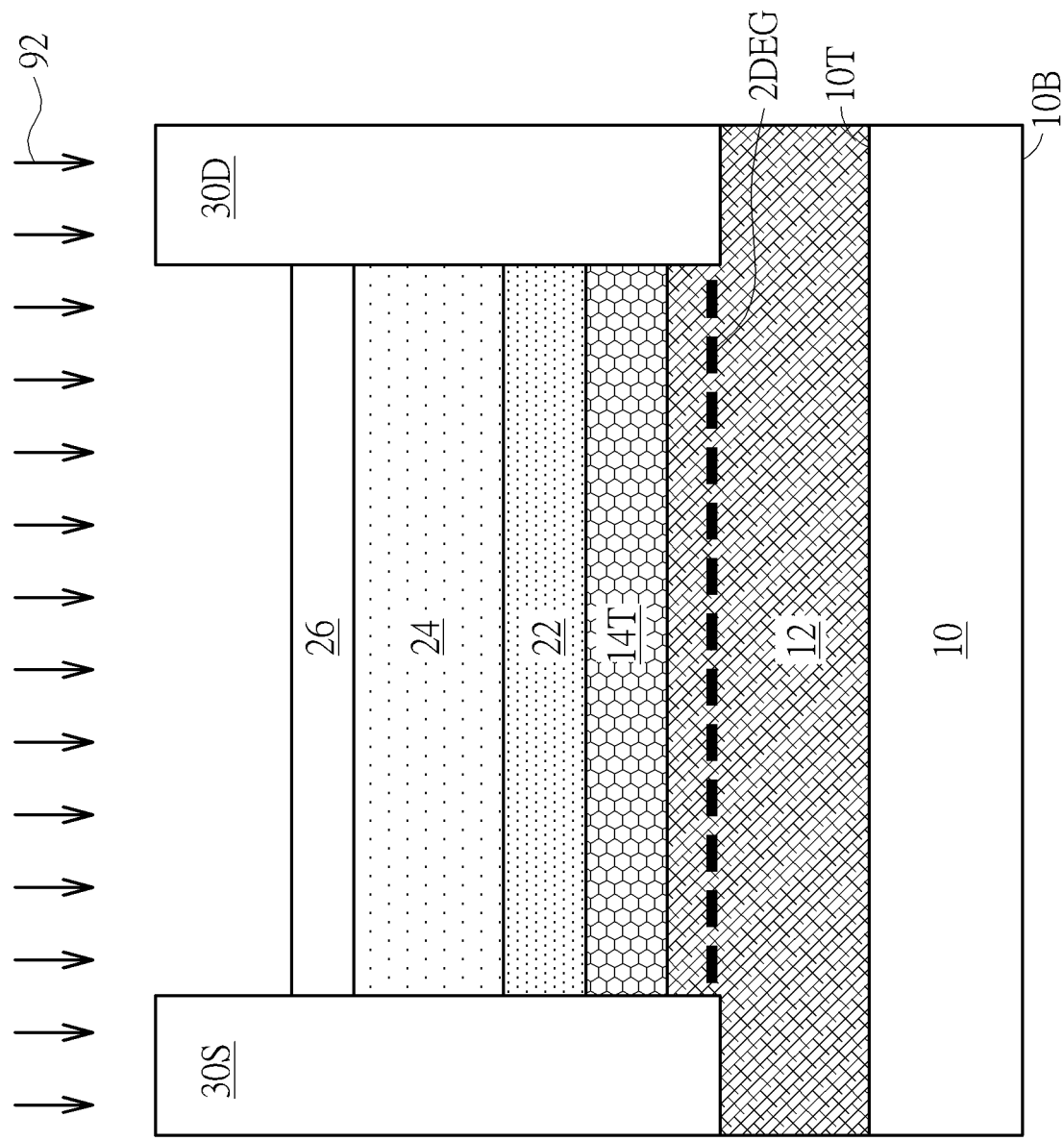
Figure 8:
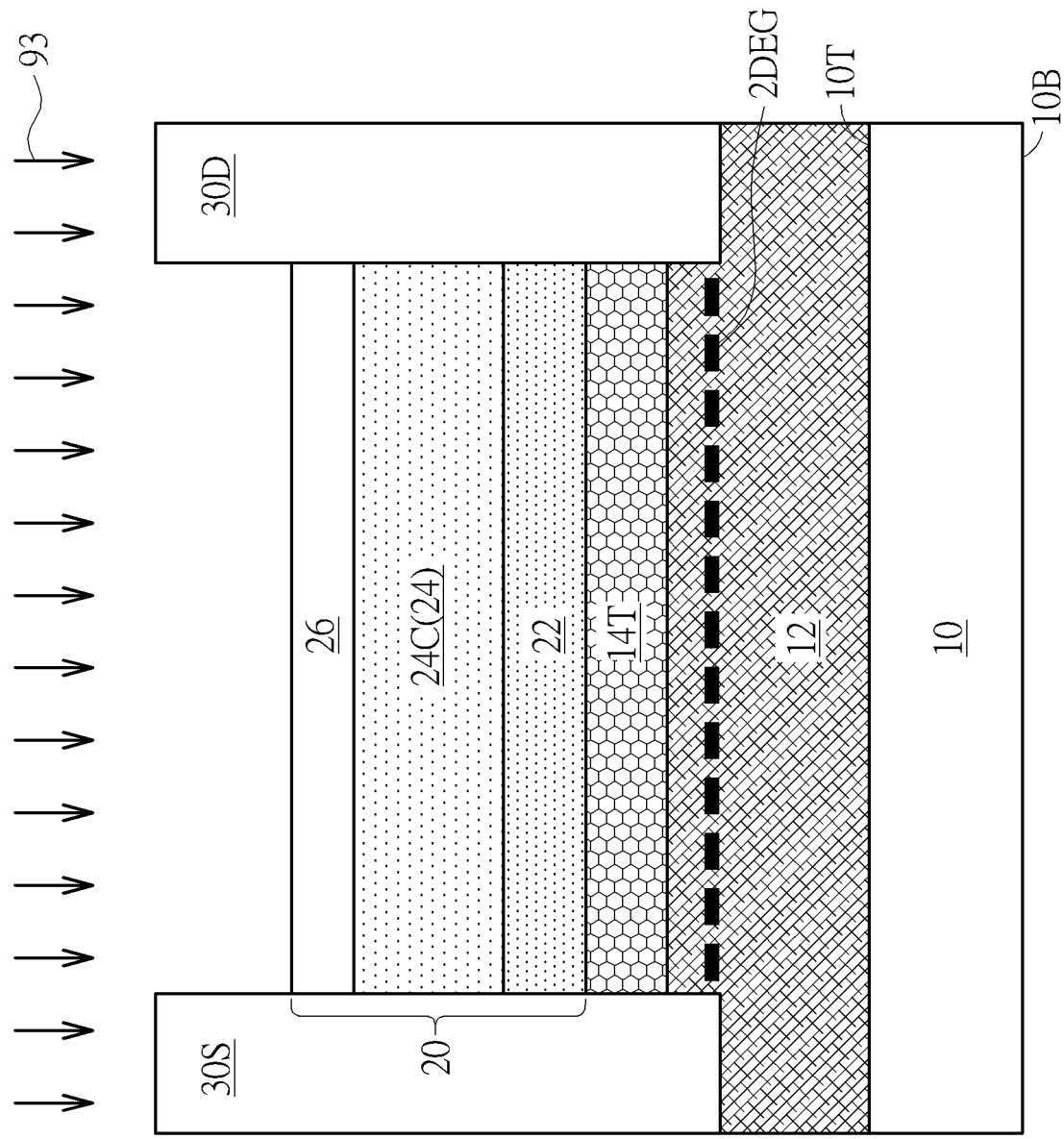

Please refer to FIGS. 1-8. FIGS. 2-8 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7. In some embodiments, FIG. 1 may be regarded as a schematic drawing in a step subsequent to FIG. 8, but not limited thereto. As shown in FIG. 2 and FIG. 3, the manufacturing method in this embodiment may include the following steps. A III-V compound barrier layer 12 is formed on the III-V compound semiconductor layer 12. The silicon-rich tensile stress layer 22 is formed on the III-V compound barrier layer 14. An annealing process 91 is performed after the silicon-rich tensile stress layer 22 is formed. A part of silicon in the silicon-rich tensile stress layer 22 diffuses into the III-V compound barrier layer 14 for forming the silicon-doped III-V compound barrier layer 14T by the annealing process 91. In some embodiments, the III-V compound barrier layer 14 may include aluminum gallium nitride, aluminum indium nitride, aluminum gallium indium nitride, aluminum nitride, or other suitable III-V compound materials. In some embodiments, the tensile stress of the silicon-doped III-V compound barrier layer 14T may be higher than the tensile stress of the III-V compound barrier layer 14 (i.e. the condition before the annealing process 91). Therefore, the silicon-rich tensile stress layer 22 and the silicon-doped III-V compound barrier layer 14T may be used to increase the tensile stress applied to the channel region in the semiconductor device, and the density of the two-dimensional electron gas 2DEG may be increased accordingly, but not limited thereto. In some embodiments, the annealing process 91 may include rapid thermal processing (RTP) or other suitable thermal processing approaches, and the process temperature of the annealing process may be higher than 800 degrees Celsius, but not limited thereto.

Specifically, the manufacturing method in this embodiment may include but is not limited to the following steps. As shown in FIG. 3 and FIG. 4, after the annealing process 91, the passivation layer 24 may be formed on the silicon-rich tensile stress layer 22, and the UV-transparent protection layer 26 may be formed on the passivation layer 24. In some embodiments, the passivation layer 24 may also be used to increase the tensile stress applied to the channel region in the semiconductor device and increase the density of the two-dimensional electron gas 2DEG, but not limited thereto. Subsequently, as shown in FIG. 4 and FIG. 5, recesses RC may be formed at the regions located corresponding to the source structure and the drain structure, and the recess RC may penetrate through the UV-transparent protection layer 26, the passivation layer 24, and the silicon-rich tensile stress layer 22 in the vertical direction D1. In some embodiments, the recess RC may further penetrate through the silicon-doped III-V compound barrier layer 14T for exposing a part of the III-V compound semiconductor layer 12, but not limited thereto. As shown in FIG. 6, a source/drain material 30 may then be formed, and the source/drain material 30 may be partly formed in the recesses RC and partly formed on the UV-transparent protection layer 26. In some embodiments, the source/drain material 30 may include a structure composed of material layers stacked with one another, such as a silicon layer and one or a plurality of metal layers formed on the silicon layer, but not limited thereto.

As shown in FIG. 6 and FIG. 7, the source/drain material 30 may be patterned to become the source structure 30S and the drain structure 30D. In some embodiments, an annealing process 92 may be performed after the source structure 30S and the drain structure 30D are formed, so as to react the silicon layer in the source/drain material with the metal layer for forming a metal silicide layer. Accordingly, Ohmic contact may be formed between the source structure 30S and the silicon-doped III-V compound barrier layer 14T and/or between the source structure 30S and the III-V compound semiconductor layer 12, and Ohmic contact may be formed between the drain structure 30D and the silicon-doped III-V compound barrier layer 14T and/or between the drain structure 30D and the III-V compound semiconductor layer 12, but not limited thereto. The annealing process 92 may include RTP or other suitable thermal processing approaches.

As shown in FIG. 7 and FIG. 8, after the annealing process 92 (i.e. after the UV-transparent protection layer 26, the source structure 30S, and the drain structure 30D are formed), an UV treatment 93 may be performed for curing the passivation layer 24 by UV passing through the UV-transparent protection layer 26. In other words, the source structure 30S and the drain structure 30D may be formed after the step of forming the UV-transparent protection layer 26 and before the UV treatment 93. In some embodiments, the material in the passivation layer 24 may rearrange via the UV irradiation, the tensile stress of the passivation layer 24 may be increased accordingly, and the tensile stress applied to the channel region of the semiconductor device may be further increased for further increasing the density of the two-dimensional electron gas 2DEG, but not limited thereto. In other words, the tensile stress of the passivation layer 24 may be increased by the UV treatment 93, the passivation layer 24 may be converted into a treated passivation layer 24C, and a tensile stress of the treated passivation layer 24C may be higher than the tensile stress of the passivation layer 24 before the UV treatment 93. In some embodiments, the tensile stress of the treated passivation layer 24C may be controlled by adjusting the process conditions of the UV treatment 93 (such as the UV irradiation time and/or the UV irradiation intensity), and the passivation layer 24 may be regarded as an embedded stress modulator accordingly, but not limited thereto. As shown in FIG. 8 and FIG. 1, after the UV treatment 93, the gate structure 40 described above may be formed for forming the semiconductor device 101

To summarize the above descriptions, in the semiconductor device and the manufacturing method thereof according to the present invention, the silicon-rich tensile stress layer may be used to form the silicon-doped III-V compound barrier layer via the annealing process. The tensile stress applied to the channel region in the semiconductor device may be increased accordingly for increasing the density of the two-dimensional electron gas. The on-resistance of the semiconductor device may be reduced, and the related electrical performance of the semiconductor device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    forming a III-V compound barrier layer on a III-V compound semiconductor layer;
    forming a silicon-rich tensile stress layer on the III-V compound barrier layer; and
    performing an annealing process after the silicon-rich tensile stress layer is formed, wherein a part of silicon in the silicon-rich tensile stress layer diffuses into the III-V compound barrier layer for forming a silicon-doped III-V compound barrier layer by the annealing process, the silicon-doped III-V compound barrier layer is disposed on the III-V compound semiconductor layer, the silicon-rich tensile stress layer is disposed on the silicon-doped III-V compound barrier layer, the silicon-rich tensile stress layer comprises silicon carbide, and the silicon-doped III-V compound barrier layer is in direct physical contact with the III-V compound semiconductor layer and the silicon-rich tensile stress layer.

2. The manufacturing method of the semiconductor device according to claim 1, further comprising:
    forming a passivation layer on the silicon-rich tensile stress layer after the annealing process.

3. The manufacturing method of the semiconductor device according to claim 2, wherein a tensile stress of the silicon-rich tensile stress layer is higher than a tensile stress of the passivation layer.

4. The manufacturing method of the semiconductor device according to claim 2, wherein a thickness of the passivation layer is greater than a thickness of the silicon-rich tensile stress layer.

5. The manufacturing method of the semiconductor device according to claim 2, further comprising:
    forming an ultraviolet (UV)-transparent protection layer on the passivation layer.

6. The manufacturing method of the semiconductor device according to claim 5, wherein a tensile stress of the passivation layer is higher than a tensile stress of the UV-transparent protection layer.

7. The manufacturing method of the semiconductor device according to claim 5, further comprising:
    performing an UV treatment after the UV-transparent protection layer is formed, wherein a tensile stress of the passivation layer is increased by the UV treatment.

8. The manufacturing method of the semiconductor device according to claim 7, further comprising:
    forming a source structure and a drain structure, wherein the source structure and the drain structure penetrate through the UV-transparent protection layer, the passivation layer, and the silicon-rich tensile stress layer in a vertical direction.

9. The manufacturing method of the semiconductor device according to claim 8, wherein the source structure and the drain structure are formed after the UV-transparent protection layer is formed and before the UV treatment.

10. The manufacturing method of the semiconductor device according to claim 7, further comprising:

forming a gate structure penetrating through the UV-transparent protection layer, the passivation layer, and the silicon-rich tensile stress layer after the UV treatment.

\* \* \* \* \*